US006026033A

United States Patent [19]

Casper

[11] Patent Number: 6,026,033

[45] Date of Patent: Feb. 15, 2000

[54] MOS TRANSISTOR CIRCUIT AND METHOD FOR BIASING A VOLTAGE GENERATOR

[75] Inventor: Steven L. Casper, Boise, Id.

[73] Assignee: Micron Technology, Inc., Boise, Id.

[21] Appl. No.: 09/260,184

[22] Filed: Mar. 1, 1999

Related U.S. Application Data

[62] Division of application No. 08/989,698, Dec. 12, 1997.

[51] Int. Cl.[7] .................. G11C 16/04

[52] U.S. Cl. .................. 365/189.09; 365/230.06; 365/226

[58] Field of Search .................. 365/189.09, 230.06, 365/226

[56] References Cited

U.S. PATENT DOCUMENTS

| | | | |
|---|---|---|---|
| Re. 34,290 | 6/1993 | Tobita | 323/313 |
| 4,663,584 | 5/1987 | Okada et al. | 323/313 |
| 4,670,706 | 6/1987 | Tobita | 323/313 |
| 4,788,455 | 11/1988 | Mori et al. | 323/314 |
| 4,812,735 | 3/1989 | Sawada et al. | 323/313 |
| 4,906,914 | 3/1990 | Ohsawa | 323/314 |
| 5,008,609 | 4/1991 | Fukiage | 323/313 |
| 5,369,354 | 11/1994 | Mori | 323/313 |
| 5,455,797 | 10/1995 | Etoh et al. | 365/189.09 |
| 5,610,550 | 3/1997 | Furutani | 327/543 |
| 5,703,475 | 12/1997 | Lee et al. | 323/313 |
| 5,717,324 | 2/1998 | Tobita | 323/313 |
| 5,757,225 | 5/1998 | Tobita | 323/313 |
| 5,787,004 | 7/1998 | Duesman | 365/200 |

*Primary Examiner*—David Nelms
*Assistant Examiner*—Thong Le
*Attorney, Agent, or Firm*—Dorsey & Whitney LLP

[57] ABSTRACT

A voltage generator circuit includes a first feedback transistor coupled between a supply voltage source and a first bias node, and a gate coupled to an output node. A first bias MOS transistor of a first conductivity type has a first signal terminal and a back-bias terminal coupled to the first bias node, and a gate and second signal terminal coupled to a tracking node. A second bias MOS transistor of a second conductivity type has a gate and a first signal terminal coupled to the tracking node, and a second signal terminal coupled to a second bias node. A second feedback transistor is coupled between the second bias node and a reference voltage source, and has a gate coupled to the output node. A first drive MOS transistor has a first signal terminal coupled to the supply voltage source, a gate coupled to the first bias node, and a second signal terminal coupled to the output node. A second drive MOS transistor has a first signal terminal coupled to the output node, a second signal terminal coupled to the reference voltage source, and a gate coupled to the second bias node.

3 Claims, 2 Drawing Sheets

MOS TRANSISTOR CIRCUIT AND METHOD FOR BIASING A VOLTAGE GENERATOR

CROSS-REFERENCE TO RELATED APPLICATION

This application is a Divisional of pending U.S. patent application Ser. No. 08/989,698, filed Dec. 12, 1997.

TECHNICAL FIELD

The present invention relates generally to voltage generator circuits, and more specifically to a low power voltage generator circuit which utilizes the body effect of tracking transistors to ensure complementary drive transistors are never simultaneously turned ON.

BACKGROUND OF THE INVENTION

In electronic circuits voltage generator circuits are utilized to provide supply and reference voltages required for operation of the circuits. For example in a conventional dynamic random access memory ("DRAM"), a bias and equilibration voltage generator circuit generates a voltage $V_{cc}/2$ used for biasing and equilibrating digit lines and for supplying a reference voltage to one plate of a storage capacitor contained in each memory cell, as known in the art. FIG. 1 is a schematic of a conventional bias and equilibration voltage generator circuit 10 utilized in a conventional DRAM to generate the bias and equilibratlon voltage $V_{cc}/2$. The voltage generator circuit 10 includes a PMOS feedback transistor 12 which presents a variable resistance between a supply voltage $V_{cc}$ and a first bias node 14 in response to an output voltage on an output node 26 applied to its gate.

The voltage generator circuit 10 further includes a bias circuit 15 comprising an NMOS diode-coupled transistor 16 coupled between the first bias node 14 and a tracking node 17, and a PMOS diode-coupled transistor IS coupled between the tracking node 17 and a second bias node 20. As understood by one skilled in the art each diode-coupled transistor 16 and 18 has its gate coupled to its drain and exhibits a current-voltage relationship that approximates a diode having a threshold voltage equal to the threshold voltage of the transistor. The threshold voltages of the diode-coupled transistors 16 and 18 are designated as $V_{tn1}$ and $V_{tp1}$, respectively. In operation the diode-coupled transistors 16 and 18 maintain a voltage differential between the first and second bias nodes 14 and 20 of approximately $V_{tn1}+V_{tp1}$. Note that the diode-coupled transistor 18 has its back-bias terminal coupled to its source in order to minimize its threshold voltage $V_{tp1}$, as will be explained in more detail below. An NMOS feedback transistor 22 presents a variable resistance between the second bias node 20 and ground, or another suitable reference voltage, in response to the voltage on the output node 26 applied to its gate.

The voltage generator circuit 10 further includes an NMOS drive transistor 24 presenting a variable resistance between the supply voltage $V_{cc}$ and the output node 26 in response to the voltage on the first bias node 14 applied to its gate, and a PMOS drive transistor 28 presenting a variable resistance between the output node 26 and ground in response to the voltage on the second bias node 20 applied to its gate. The driver transistors 24 and 28 are typically formed having larger current driving capacities than the transistors 12. 16. 18. and 22 to provide sufficient current for driving loads coupled to the output node 26. In addition, such large current driving capacity enables the transistors 24 and 28 to quickly return the voltage on the output node 26 to the desired output voltage in response to load variations. The larger current driving capacity of the transistors 24 and 28 may be achieved for example by increasing the respective channel widths of the transistors.

The transistors 16, 18. 24, and 28 have threshold voltages $V_{tn1}$, $V_{tp1}$, $V_{tn2}$, and $V_{tp2}$, as shown in FIG. 1. These threshold voltages determine the value of the output voltage developed by the generator circuit 10 on output node 26. In the bias and equilibration circuit 10, the desired output voltage on the node 26 is $V_{cc}/2$, and the respective threshold voltages are selected accordingly. In addition the threshold voltages ideally have values which ensure the NMiOS drive transistor 24 and PMOS drive transistor 28 do not simultaneously present relatively low resistances between their respective sources and drains. If both the drive transistors 24 and 28 simultaneously present low resistances, a large current may flow from the supply voltage $V_{cc}$ through the transistors 24 and 28 to ground causing the voltage generator circuit 10 to dissipate a large amount of power. No such current path is present as long as the transistors 24 and 28 do not simultaneously present low resistances. To ensure the drive transistors 24 and 28 do not simultaneously present low resistances, the diode-coupled transistors 16 and 18 and driver transistors 24 and 28 are formed such that the summation of the threshold voltages of the diode-coupled transistors 16 and 18 is less than the summation of the threshold voltages of the drive transistors 24 and 28: $V_{tn1}+V_{tp1}<V_{tn2}+V_{tp2}$. One skilled in the art will realize a finite current may flow through the drive transistors 24 and 28 even when the threshold voltages satisfy the desired relationship but when the threshold voltages are so selected the power dissipated due to such finite current is typically negligible.

In operation of the voltage generator circuit 10, under quiescent operating conditions the output voltage on node 26 equals $V_{cc}/2$, causing the feedback transistors 12 and 22 to drive the control nodes 14 and 20 to respective bias voltages. For the circuit 10, the tracking node 17 is at approximately the voltage $V_{cc}/2$ so the bias voltages on nodes 14 and 20 are approximately $V_{cc}/2+V_{tn1}$ and $V_{cc}/2-V_{tp1}$, respectively. Under these quiescent conditions, both drive transistors 24 and 28 present relatively high resistances. When external circuitry (not shown in FIG. 1) loads the output node 26 the output voltage on node 26 deviates from the desired output voltage $V_{cc}/2$. Two things occur when the output voltage on node 26 does lower than the desired value $V_{cc}/2$ by a predetermined amount. First, the feedback transistor 12 drives the voltage on the first bias node 14 toward the supply voltage $V_{cc}$ in response to the decreasing voltage on node 26. Second, in response to the increasing voltage on the first bias node 14, the NMOS drive transistor 24 drives the voltage on the output node 26 toward the supply voltage $V_{cc}$. As the NMOS drive transistor 24 drives the output voltage on node 26 toward the voltage $V_{cc}$ and thereby back to the desired output voltage $V_{cc}/2$, the feedback transistor 12 drives the voltage on the first bias node 14 back to the bias voltage until the quiescent operating condition is once again established.

When the output voltage on node 26 increases above the desired output voltage $V_{cc}/2$, the feedback transistor 22 and drive transistor 28 operate similar to transistors 12 and 24 to restore the desired output voltage. First, the feedback transistor 22 drives the voltage on the second bias node 20 toward ground in response to the increasing voltage on node 26. Second, in response to the decreasing voltage on the second control node 20, the PMOS drive transistor 28 drives the voltage on the output node 26 toward ground. As the PMOS drive transistor 28 drives the output voltage on node 26 toward ground and thereby back to the desired output voltage $V_{cc}/2$, the feedback transistor 22 drives the voltage on the second bias node 20 back to the bias voltage until the quiescent operating condition is again established.

As previously discussed, proper operation of the voltage generator circuit 10 requires the diode-coupled transistors 16 and 18 be formed having respective threshold voltages satisfying the relationship $V_{tn1}+V_{tp1}<V_{tn2}+V_{tp2}$, which may be difficult to do. The threshold voltages of the diode-coupled transistors 16 and 18 may be reduced in a variety of ways, including varying the channel width of the transistors, and varying the doping concentration in various regions of the transistors. Reducing the threshold voltages of the diode-coupled transistors 16 and 18 through either of these methods, however, may result in undesirable additional process steps when forming the voltage generator circuit 10. Another method of reducing the threshold voltage of a MOS transistor is utilizing the "body effect" of the transistor by coupling the back-bias voltage terminal of the transistor to its source. The body effect of a MOS transistor is the variation in the threshold voltage of the transistor as a function of the voltage across the source-substrate junction of the transistor. As understood by those skilled in the art, the threshold voltage of a NIOS transistor increases as the source-substrate voltage increases and decreases as the source-substrate voltage decreases.

In the circuit 10, the body effect of the transistor 18 is utilized to lower its threshold voltage $V_{tp1}$ by coupling its back-bias terminal to its source such that the source-substrate voltage of the transistor is approximately zero. It should be noted that typically the back-bias voltage terminal of both the diode-coupled transistors 16 and 18 may not be simultaneously coupled to their respective sources because the threshold voltages of other transistors formed in the semiconductor substrate containing the voltage generator circuit 10 may be undesirably affected. Typically, one of the diode-coupled transistors 16 and 18 is formed in a well region, and it is this transistor whose back-bias voltage terminal is coupled to its source. In the embodiment of FIG. 1. the voltage generator circuit 10 is formed in a p-type semiconductor substrate with the diode-coupled transistor 16 formed in the substrate and the diode-coupled transistor 18 formed in an n-well region. Thus, the back-bias voltage terminal of the transistor 18 is coupled to its source while the back-bias voltage terminal of the transistor 16 is typically coupled to a negative voltage source, such as a −1.2 volt substrate pump circuit, or to ground. In this configuration, the transistor 18 has the threshold voltage $V_{tp1}$ corresponding to a zero source-substrate voltage and the transistor 16 has the threshold voltage $V_{tn1}$ corresponding to the voltage on the node 17 (approximately $V_{cc}/2$ under quiescent operating conditions). The voltage on the node 17 increases the threshold voltage $V_{tn1}$ relative to the value for zero source substrate voltage, which makes it more difficult to ensure $V_{tn1}+V_{tp1}$ is less than $V_{tn2}+V_{tp2}$ as desired.

There is a need for a voltage generator circuit including two series connected diode-coupled transistors having reduced threshold voltages to ensure low power operation of the voltage generator circuit.

SUMMARY OF THE INVENTION

A voltage generator circuit includes a first drive MOS transistor having a first signal terminal adapted to receive a supply voltage, a gate terminal coupled to a first bias node and a second signal terminal coupled to an output node. A second drive MNOS transistor has a first signal terminal coupled to the output node, a second signal terminal adapted to receive a reference voltage, and a gate terminal coupled to a second bias node. A feedback circuit is coupled to the output node, and is adapted to receive the supply and reference voltages. The feedback circuit develops first and second bias voltages on the first and second bias nodes, respectively, in response to a signal on the output node. A bias circuit includes a first diode-coupled MOS bias transistor of a first conductivity type having its source coupled to the first bias node and drain coupled to a tracking node. A second diode-coupled MOS bias transistor of a second conductivity type has its source coupled to the second bias node and drain coupled to the tracking node. One of the first and second MOS bias transistors is formed in a well region in semiconductor substrate and has its source coupled to its substrate.

DETAILED DESCRIPTION OF THE INVENTION

Figure 1:
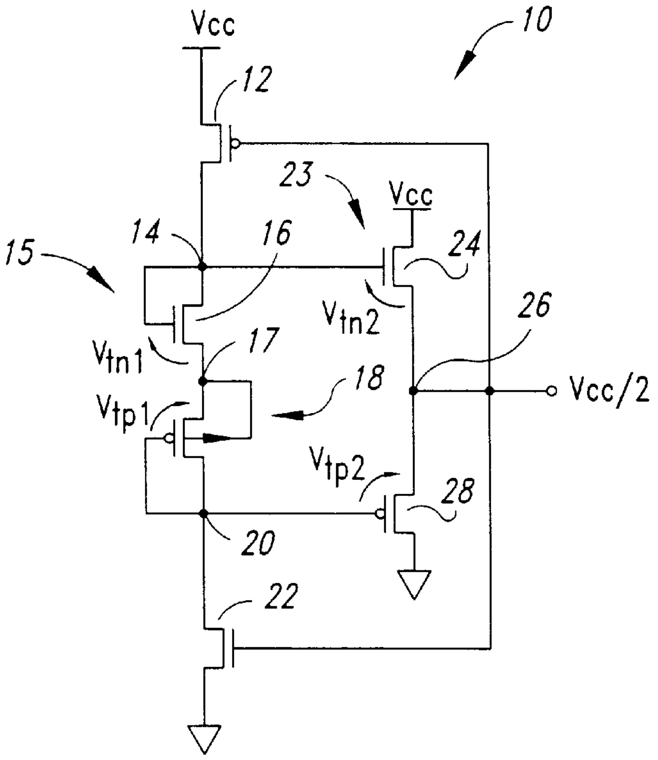
Fig. 1 (PRIOR ART)
FIG. 1 a schematic of a conventional bias and equilibration voltage generator circuit.
Figure 2:
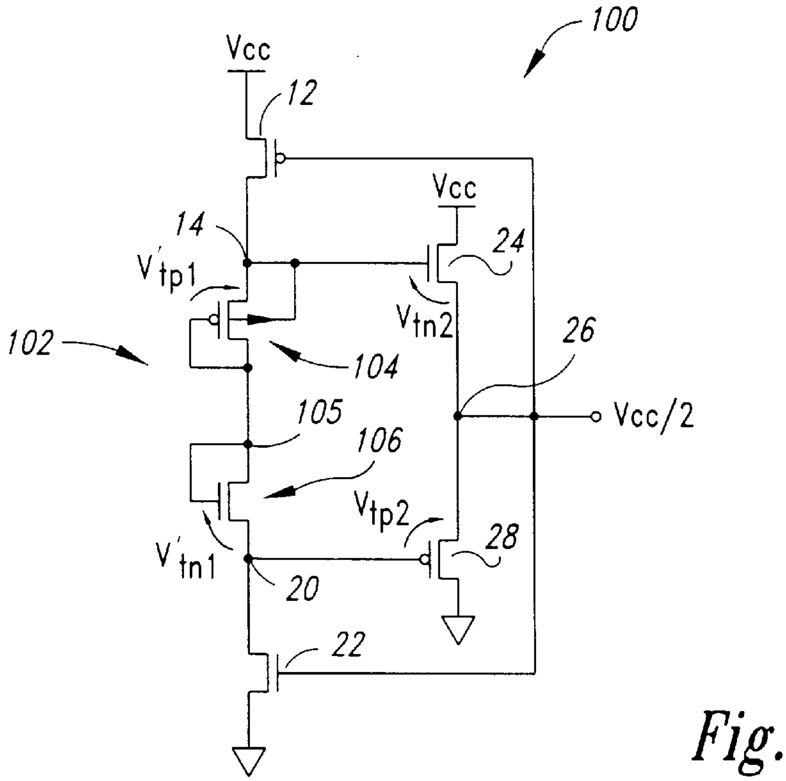
FIG. 2 is a schematic of a bias and equilibration voltage generator circuit according to one embodiment of the present invention.

FIG. 2 is a schematic of a bias and equilibration voltage generator circuit 100 according to one embodiment of the present invention. In the voltage generator circuit 100, components that are the same as those previously described with reference to FIG. 1 have been given the same reference numerals and for the sake of brevity will not be described in further detail. The voltage generator circuit 100 includes an improved bias circuit 102 which reduces the voltage differential between the bias nodes 14 and 20 and ensures that drive MOS transistors 24 and 28 do not simultaneously present low resistances for the reasons previously discussed with reference to FIG. 1. The bias circuit 102 includes a PMOS diode-coupled transistor 104 and an NMOS diode-coupled transistor 106 coupled respectively between the control nodes 14 and 20. The back-bias voltage terminal of the PMOS diode-coupled transistor 104 is coupled to the bias node 14, causing the source-substrate voltage of the transistor 104 to be approximately zero. The PMOS diode-coupled transistor 104 has a threshold voltage $V'_{tp1}$ corresponding to the threshold voltage for zero source-substrate voltage.

In the bias circuit 102, the NIOS diode-coupled transistor 106 has its source coupled to the bias node 20, its drain coupled to a tracking node 105, and its back-bias voltage terminal (not shown in FIG. 2) typically coupled to a negative voltage source or to ground. By coupling the NMOS diode-coupled transistor 106 in this way the transistor has a reduced threshold voltage $V'_{tn1}$ relative to the threshold voltage $V_{tn1}$ of the diode-coupled transistor 16. The threshold voltage $V'_{tn1}$ is reduced due to a corresponding reduction in the source-substrate voltage of the transistor 106. The source-substrate voltage of the transistor 106 is reduced relative to the transistor 16 at the prior art circuit 10 because the positions of the PMOS transistor 104 and the NMOS transistor 106 are reversed relative to the positions of the PMOS transistor 18 and the NMOS transistor 16 in the prior art circuit 10. As a result, the source of the transistor 106 is at a voltage that is $V'_{tp1}$ lower than the voltage on the source of the transistor 16 in the prior art circuit 10 of FIG. 1. The reduced source voltage reduces the source-to-substrate voltage, thereby reducing the threshold voltage of the NMOS transistor 106.

The operation of the circuit 100 is the same as that previously described with reference to FIG. 1. and for the sake of brevity will not be described in further detail. In the voltage generation circuit 100, however, the reduced threshold voltage $V'_{tn1}$ of the NMOS diode-coupled transistor 106 ensures the threshold voltages of the transistors 24. 28, 104, and 106 satisfy the relationship $V'_{tp1}+V'_{tn1}<V_{tn2}+V_{tp2}$ as required to prevent the drive transistors 24 and 28 from simultaneously presenting low resistances. In addition, it should be noted that the reduction in the threshold voltage $V'_{tn1}$ of the NMOS diodecoupled transistor 106 is accomplished without requiring additional process steps while forming the voltage generator circuit 100.

In the embodiment of FIG. 2, the voltage generator circuit 100 is formed in a p-type semiconductor substrate. As a result, the PMOS transistor 104 has its source coupled to the n-well to minimize the threshold voltage $V'_{tp1}$. The circuit 100 may also be formed in an n-type semiconductor substrate. In this embodiment, the NMOS transistor 106 is formed in a p-well with its source coupled to the p-well and the substrate of the PMOS transistor 104 would typically be coupled to the supply voltage $V_{cc}$.

Figure 3:
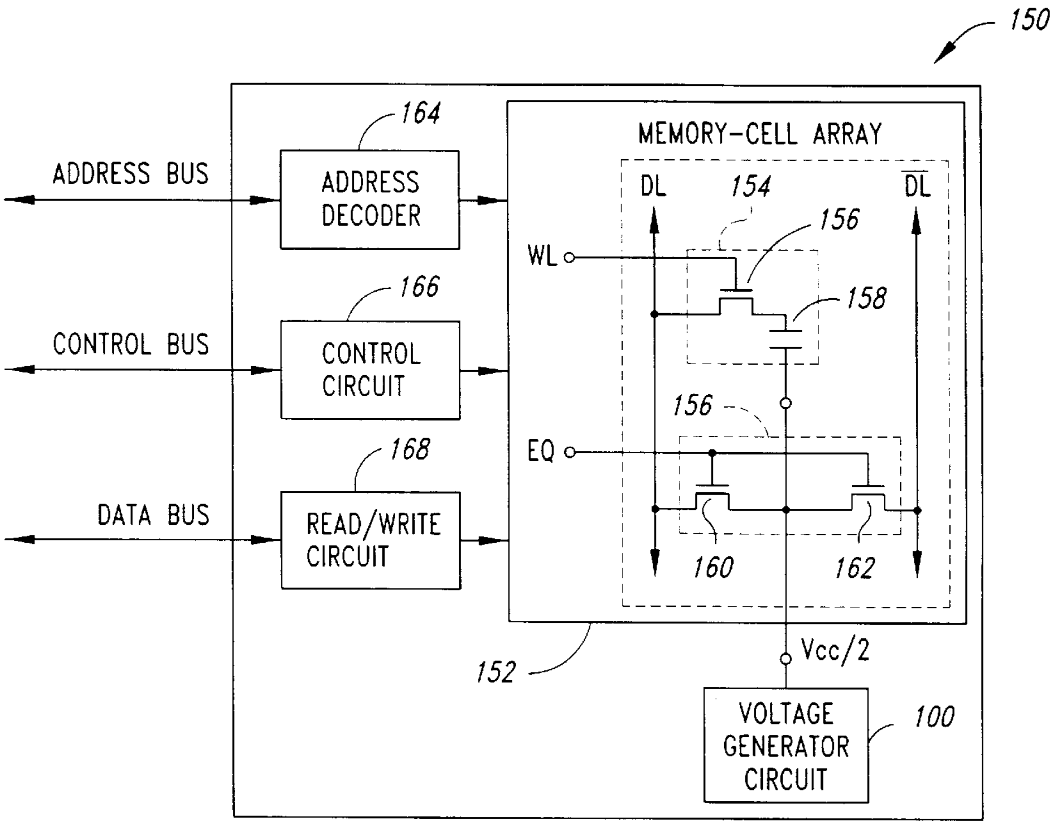
FIG. 3 is a block diagram of a memory device including the bias and equilibration voltage generator circuit of FIG. 2.

FIG. 3 is a block diagram of a memory device 150 including the voltage generator circuit 100. The memory device 150 includes a memory-cell array 152 having a number of memory cells 154 arranged in rows and columns, one of which is shown. The memory-cell array 152 further includes a word line WL associated with each row of memory cells 154 and a pair of complementary dial lines DL and $\overline{DL}$ associated with each column of memory cells, as shown for the illustrated memory cell 154. Each memory cell 154 includes an access transistor 156 having its gate coupled to the associated word line WL its drain coupled to one of the associated digit lines DL and $\overline{DL}$, and its source coupled to one terminal of an associated storage capacitor 158. The other terminal of the storage capacitor 158 receives the output voltage $V_{cc}/2$ from the voltage generator circuit 100.

The voltage generator circuit 100 also provides the reference voltage $V_{cc}/2$ to a number of equilibration circuits 156 in the memory-cell array 152, one of which is shown. Each equilibration circuit 156 is coupled between the digit lines DL and $\overline{DL}$ associated with a column of memory cells. and includes transistors 160 and 162 coupled as shown to receive the reference voltage $V_{cc}/2$ and an equilibration signal EQ. When the equilibration signal EQ is active, the transistors 160 and 162 turn ON coupling the digit lines DL and $\overline{DL}$ to the reference voltage $V_{cc}/2$ and biasing the digit lines at this voltage. The detailed illustration of the memory cell 154 and equilibration circuit 156 are merely to illustrate a typical application of the voltage generator circuit 100 in the memory device 150. One skilled in the art will understand the operation of these components during data transfer operations of the memory device 150, and thus, for the sake of brevity, a more detailed explanation of these components during such data transfer operations is not provided.

The memory device 150 further includes an address decoder 164 which receives an address on an address bus, decodes that address, and activates the memory cell corresponding to the decoded memory address. A control circuit 166 receives control signals on a control bus and controls operation of the memory-cell array 152 during data transfer operations. A read/write circuit 168 is coupled to a data bus and transfers data between the data bus and the memory-cell array 152 during read/write data transfer operations.

In operation, external circuitry provides address, control, and data signals on respective busses to the memory device 150. During a read cycle, the external circuitry provides a memory address on the address bus and control signals on the control bus. In response to the memory address on the address bus, the address decoder 164 provides a decoded memory address to the memory-cell array 152 while the control circuit 166 provides control signals to the memory-cell array 152 in response to the control signals on the control bus. The control signals from the control circuit 166 control the memory-cell array 152 so that the memory-cell array provides the addressed data to the read/write circuit 168. The read/write circuit 168 then provides this data on the data bus for use by the external circuitry. During a write cycle, the external circuitry provides a memory address on the address bus, control signals on the control bus, and data on the data bus. Once again, the address decoder 164 decodes the memory address on the address bus and provides a decoded address to the memory-cell array 152. The read/write circuit 168 provides the data on the data bus to the memory-cell array 152 and this data is stored in the addressed memory cells in the memory-cell array 152 under control of the control circuit 166.

Figure 4:
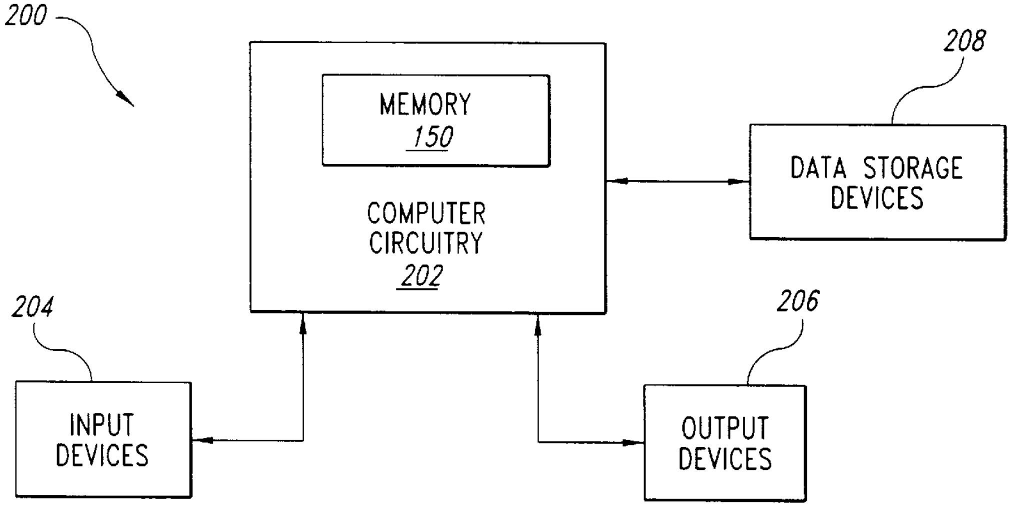
FIG. 4 is a block diagram of a computer system including the memory device of FIG. 4.

FIG. 4 is a block diagram of a computer system 200 including the memory device 150 of FIG. 3. The computer system 200 includes computer circuitry 202 for performing various computing functions, such as executing specific software to perform specific calculations or tasks. In addition, the computer system 200 includes one or more input devices 204, such as a keyboard or a mouse, coupled to the computer circuitry 202 to allow an operator to interface with the computer system 200. Typically, the computer system 200 also includes one or more output devices 206 coupled to the computer circuitry 202, such output devices typically being a printer or a video terminal. One or more data storage devices 208 are also typically coupled to the computer circuitry 202 to store data or retrieve data from external storage media (not shown). Examples of typical data storage devices 208 include hard and floppy disks, tape cassettes, and compact disk read only memories ("CD-ROMs"). The computer circuitry 202 is typically coupled to the memory device 150 through a control bus, a data bus and an address bus to provide for writing data to and reading data from the memory device 150.

It is to be understood that even though various embodiments and advantages of the present invention have been set forth in the forgoing description, the above disclosure is illustrative only and changes may be made in detail, and yet remain within the broad principles of the invention. Therefore, the present invention is to be limited only by the appended claims.

I claim:

1. A method for generating a voltage on an output node in a memory device, the voltage being generated in response to first and second bias voltages developed on first and second bias nodes, respectively, by two diode-coupled MOS transistors connected in series between the first and second bias nodes, one diode-coupled transistor receiving its back-bias voltage from the first bias node and the other diode-coupled transistor having its source coupled to the second bias node, the method comprising the steps of:

applying a supply voltage to the memory device;

driving the first bias voltage on the first bias node toward the supply voltage when the output voltage drops below a desired value;

driving the output voltage toward the supply voltage in response to the first bias voltage;

driving the second bias voltage on the second bias node toward a reference voltage when the output voltage rises above the desired value; and driving the output voltage toward the reference voltage in response to the second bias voltage.

2. The method of claim 1 wherein the supply voltage is approximately equal to five volts and the reference voltage is approximately equal to zero volts.

3. The method of claim 1 wherein the desired value of the output voltage equals approximately the supply voltage divided by two.

* * * * *

UNITED STATES PATENT AND TRADEMARK OFFICE

CERTIFICATE OF CORRECTION

PATENT NO. : 6,026,033

DATED : February 15, 2000

INVENTOR(S) : Stephen L. Casper

It is certified that error appears in the above-identified patent and that said Letters Patent is hereby corrected as shown below:

| | | | |
|---|---|---|---|
| Title page, item | [75] Inventor | Reads | Should Read |
| | Inventor | "Steven" | -- Stephen -- |

Signed and Sealed this

First Day of May, 2001

Attest:

NICHOLAS P. GODICI

*Attesting Officer* *Acting Director of the United States Patent and Trademark Office*